(12) United States Patent
Lee et al.

(10) Patent No.: US 9,040,958 B2
(45) Date of Patent: May 26, 2015

(54) TRANSISTORS AND METHODS OF MANUFACTURING THE SAME

(71) Applicant: Samsung Electronics Co., Ltd., Suwon-Si, Gyeonggi-Do (KR)

(72) Inventors: Chang-seung Lee, Yongin-si (KR); Yong-sung Kim, Namyangju-si (KR); Joo-ho Lee, Hwaseong-si (KR); Yong-seok Jung, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 28 days.

(21) Appl. No.: 13/792,525

(22) Filed: Mar. 11, 2013

(65) Prior Publication Data
US 2014/0021446 A1   Jan. 23, 2014

(30) Foreign Application Priority Data

Jul. 23, 2012   (KR) .................. 10-2012-0080251

(51) Int. Cl.
| *H01L 29/06* | (2006.01) |
| *H01L 29/16* | (2006.01) |
| *H01L 29/66* | (2006.01) |
| *H01L 29/78* | (2006.01) |
| *H01L 29/49* | (2006.01) |
| *H01L 29/786* | (2006.01) |

(52) U.S. Cl.
CPC ...... *H01L 29/1606* (2013.01); *H01L 29/66045* (2013.01); *H01L 29/78* (2013.01); *H01L 29/4908* (2013.01); *H01L 29/78684* (2013.01); *H01L 29/78696* (2013.01)

(58) Field of Classification Search
USPC .......... 257/15, 25, 28–29, E29.168; 438/197, 438/478
See application file for complete search history.

(56) References Cited

U.S. PATENT DOCUMENTS

| 2010/0025660 | A1* | 2/2010 | Jain et al. ........................ 257/24 |
| 2011/0017979 | A1 | 1/2011 | Meric et al. |
| 2011/0042650 | A1 | 2/2011 | Avouris et al. |
| 2011/0068290 | A1 | 3/2011 | Haddon et al. |
| 2011/0089403 | A1 | 4/2011 | Woo et al. |
| 2011/0269629 | A1* | 11/2011 | Giustino et al. .............. 505/100 |
| 2012/0085991 | A1* | 4/2012 | Cohen et al. ................... 257/28 |

FOREIGN PATENT DOCUMENTS

| JP | 2006216716 A | 8/2006 |
| JP | 2009111004 A | 5/2009 |
| JP | 2011066427 A | 3/2011 |
| KR | 20110056868 A | 5/2011 |

OTHER PUBLICATIONS

Extended European Search Report dated Sep. 16, 2013, issued in European Patent Application No. 13174783.4.

* cited by examiner

*Primary Examiner* — Mark A Laurenzi
(74) *Attorney, Agent, or Firm* — Harness, Dickey & Pierce, P.L.C.

(57) ABSTRACT

Transistors, and methods of manufacturing the transistors, include graphene and a material converted from graphene. The transistor may include a channel layer including graphene and a gate insulating layer including a material converted from graphene. The material converted from the graphene may be fluorinated graphene. The channel layer may include a patterned graphene region. The patterned graphene region may be defined by a region converted from graphene. A gate of the transistor may include graphene.

22 Claims, 17 Drawing Sheets

TRANSISTORS AND METHODS OF MANUFACTURING THE SAME

CROSS-REFERENCE TO RELATED APPLICATION

This application claims the benefit of priority under 35 U.S.C. §119 from Korean Patent Application No. 10-2012-0080251, filed on Jul. 23, 2012, in the Korean Intellectual Property Office, the disclosure of which is incorporated herein by reference in its entirety.

BACKGROUND

1. Field

The present disclosure relates to transistors and methods of manufacturing the transistors, and more particularly, to graphene transistors and methods of manufacturing the graphene transistors.

2. Description of the Related Art

Graphene is a single-layer hexagonal structure consisting of carbon atoms that is stable chemically and structurally, and exhibits excellent electrical/physical properties. For example, graphene has a charge mobility of up to about $2 \times 10^5$ $cm^2/Vs$, which is more than one hundred times faster than that of silicon (Si), and has a current density of about $10^8$ $A/cm^2$, which is more than one hundred times greater than that of copper (Cu). Thus, graphene has drawn attention as a next-generation material that may overcome limitations in general devices.

Due to various advantages of graphene, many studies have been conducted to apply graphene to various electronic devices (e.g., transistors). However, it is difficult to manufacture a device by using graphene because there are some limitations in a process of forming graphene. In addition, defects occurring in an interface between graphene and another material may deteriorate characteristics of an electronic device including the graphene.

SUMMARY

The present disclosure relates to transistors and methods of manufacturing the transistors, and more particularly, to graphene transistors and methods of manufacturing the graphene transistors.

Provided are transistors, which use graphene and a material converted from graphene.

Provided are transistors that prevent interface defects between a graphene channel layer and a material layer (e.g., a gate insulating layer) which contacts the graphene channel layer.

Provided are transistors in which a channel layer, a gate insulating layer, and a gate are formed of graphene or a material converted from graphene.

Provided are methods of manufacturing the transistors.

According to an example embodiment, a transistor includes a channel layer including graphene, a gate insulating layer on a surface of the channel layer and including fluorinated graphene, a gate facing the channel layer, the gate insulating layer being between the gate and the channel layer, and a source and a drain being respectively electrically connected to first and second regions of the channel layer.

The gate may include graphene.

The channel layer may include a patterned graphene region. The patterned graphene region may be a nanoscale patterned region.

The channel layer may include a fluorinated graphene region and a non-fluorinated graphene region, and the non-fluorinated graphene region may correspond to the patterned graphene region.

The patterned graphene region may include a graphene nanoribbon (GNR) region.

The patterned graphene region may include a graphene nanomesh (GNM) region.

The channel layer may be a single-layer graphene.

The gate insulating layer may be a fluorinated single-layer graphene.

The gate insulating layer may further include an insulating layer between the fluorinated graphene and the gate.

The gate insulating layer may be on a portion of the channel layer, the source may be on the channel layer at one side of the gate insulating layer, and the drain may be on the channel layer at another side of the gate insulating layer.

The transistor may further include a first graphene region between the channel layer and the source, and a second graphene region between the channel layer and the drain.

According to another example embodiment, a transistor includes a channel layer which includes a region comprised of graphene with a chemical modifier attached and a patterned graphene region defined by the region, a gate insulating layer on a surface of the channel layer, a gate facing the channel layer, the gate insulating layer being between the gate and the channel layer, and a source and a drain electrically connected to first and second regions of the channel layer, respectively.

The region comprised of graphene with a chemical modifier attached may be chemically converted from graphene without the chemical modifier attached.

The region comprised to graphene with a chemical modifier attached may be a fluorinated graphene region.

The patterned graphene region may include a graphene nanoribbon (GNR) region or a graphene nanomesh (GNM) region.

The gate insulating layer may include fluorinated graphene.

The gate may include graphene.

According to yet another example embodiment, a transistor includes a channel layer, a gate insulating layer, a gate, a source, and a drain, wherein the channel layer, the gate insulating layer, and the gate include at least one of graphene and a material comprised of graphene with a chemical modifier attached.

The material comprised of graphene with a chemical modifier attached may be chemically converted from graphene without the chemical modifier attached.

The gate insulating layer may include fluorinated graphene.

The channel layer may include graphene.

The channel layer may include a fluorinated graphene region and a patterned graphene region defined by the fluorinated graphene region.

The gate may include graphene.

According to still another example embodiment, a method of manufacturing a transistor includes forming a multi-layer structure, which includes a channel layer having graphene and a gate insulating layer including fluorinated graphene; forming a gate facing the channel layer, the gate insulating layer being interposed between the gate and the channel layer; and forming a source and a drain, which are electrically connected to first and second regions of the channel layer, respectively.

The forming of a multi-layer structure may include forming a multi-layer graphene on a substrate, the multi-layer graphene including a first graphene and a second graphene; and converting at least a portion of the second graphene into a fluorinated graphene.

The method may further include forming a mask pattern having an opening on the second graphene; converting a region of the second graphene exposed by the opening into the fluorinated graphene; and removing the mask pattern and the second graphene portion under the mask pattern.

The forming of the multi-layer structure may include forming a first graphene on a substrate; and transferring a fluorinated graphene from another substrate onto the first graphene.

The method may further include patterning the fluorinated graphene.

The fluorinated graphene may be formed by treating graphene with $XeF_2$.

The treating with $XeF_2$ may be performed at room temperature.

The fluorinated graphene may be formed by performing a thermal fluorination process on graphene.

The thermal fluorination process may be performed by using fluorine ($F_2$) gas at a temperature in a range of about 500° C. to about 600° C.

The gate may include graphene.

The method may include forming a multi-layer graphene on a substrate, the multi-layer graphene including a first graphene and a second graphene, and the channel layer including the first graphene; converting a portion of the second graphene into a fluorinated graphene, the gate insulating layer including the fluorinated graphene converted from the second graphene; transferring a third graphene onto the second graphene; and forming a patterned graphene on the fluorinated graphene by patterning the third graphene, the gate including the patterned graphene.

According to a further example embodiment, a method of manufacturing a transistor includes preparing a multi-layer structure including a channel layer and a gate insulating layer on the channel layer, the channel layer including a patterned graphene region defined by a region chemically converted from graphene; forming a gate facing the channel layer, the gate insulating layer being interposed between the gate and the channel layer; and forming a source and a drain, which are electrically connected to first and second regions of the channel layer, respectively.

The region chemically converted from graphene may be a fluorinated graphene region.

The patterned graphene region may include a graphene nanoribbon (GNR) region or a graphene nanomesh (GNM) region.

The gate insulating layer may include fluorinated graphene.

The preparing of a multi-layer structure may include forming a multi-layer graphene including a first graphene and a second graphene on a first substrate; defining the patterned graphene region by chemically converting a portion of the second graphene; transferring the second graphene including the patterned graphene region and the first graphene onto a second substrate; and forming the gate insulating layer by chemically converting a region of the first graphene disposed on the patterned graphene region.

After the forming of the gate insulating layer, the method may further include transferring a third graphene onto the gate insulating layer; and forming a gate region from the third graphene.

After the forming of a gate region, the method may further include removing portions of the third graphene at both sides of the gate region so as to expose portions of the first graphene; and removing the portions of the first graphene exposed at the both sides of the gate region so as to expose portions of the second graphene.

The source and the drain may be formed on the portions of the second graphene exposed at the both sides of the gate region.

The channel layer may be formed by chemically modifying a region of the graphene, and patterning the chemically-modified region to form the patterned graphene region defined by a remaining portion of the chemically-modified region.

The chemically modifying a region of the graphene may include fluorinating the region of the graphene.

BRIEF DESCRIPTION OF THE DRAWINGS

Example embodiments will be more clearly understood from the following detailed description taken in conjunction with the accompanying drawings. FIGS. 1-11 represent non-limiting, example embodiments as described herein.

FIG. 1 is a cross-sectional view illustrating a transistor according to an example embodiment;

FIG. 3 is a cross-sectional view illustrating a transistor according to another example embodiment;

FIG. 4 is a cross-sectional view illustrating a transistor according to yet another example embodiment;

FIG. 5 is a plan view exemplarily illustrating a plane structure of main elements of a transistor illustrated in FIG. 4;

FIG. 6 is a plan view illustrating an example of a modification of FIG. 5;

FIG. 11 is a cross-sectional view illustrating a portion of a transistor according to still yet another example embodiment.

DETAILED DESCRIPTION

Figure 1:
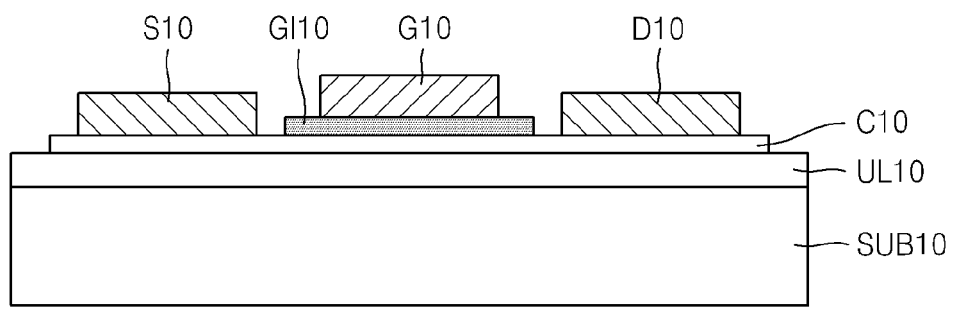

Various example embodiments will now be described more fully with reference to the accompanying drawings in which some example embodiments are shown. However, specific structural and functional details disclosed herein are merely representative for purposes of describing example embodiments, and thus may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, transistors and methods of manufacturing the transistors, according to example embodiments, will be described in detail with reference to the accompanying drawings.

FIG. 1 is a cross-sectional view illustrating a transistor according to an example embodiment.

Referring to FIG. 1, a channel layer C10 including graphene may be disposed on a substrate SUB10. For example, the channel layer C10 may be a single-layer graphene (i.e., a single graphene sheet). In some cases, the channel layer C10 may have a structure in which a plurality of graphene layers (e.g., within ten layers) are stacked. A predetermined (or, alternatively, set) underlayer UL10 may be disposed between the substrate SUB10 and the channel layer C10. For example, when the substrate SUB10 is a silicon substrate, the underlayer UL10 may be a silicon oxide layer. However, the material of the substrate SUB10 and the material of the underlayer UL10 may be variously changed. The underlayer UL10 may not be disposed.

A gate insulating layer GI10 including a material (an insulation material) chemically converted from graphene may be disposed on the channel layer C10. The material chemically converted from graphene may be fluorinated graphene. For example, the gate insulating layer GI10 may be a fluorinated single-layer graphene. When processing graphene by using fluorine, a fluorinated graphene may be formed as carbon atoms of the graphene combined with the fluorine and may have insulation characteristics. In addition, the fluorinated graphene may have characteristics that are similar to those of an insulating polymer. Thus, the fluorinated graphene may be used as a material of the gate insulating layer GI10.

Figure 2A:
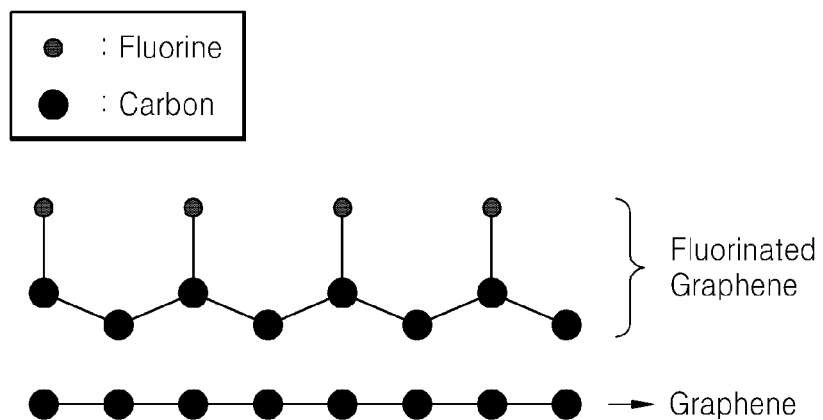
FIGS. 2A and 2B are chemical structure diagrams illustrating atomic structures of graphene and fluorinated graphene.
Figure 2B:
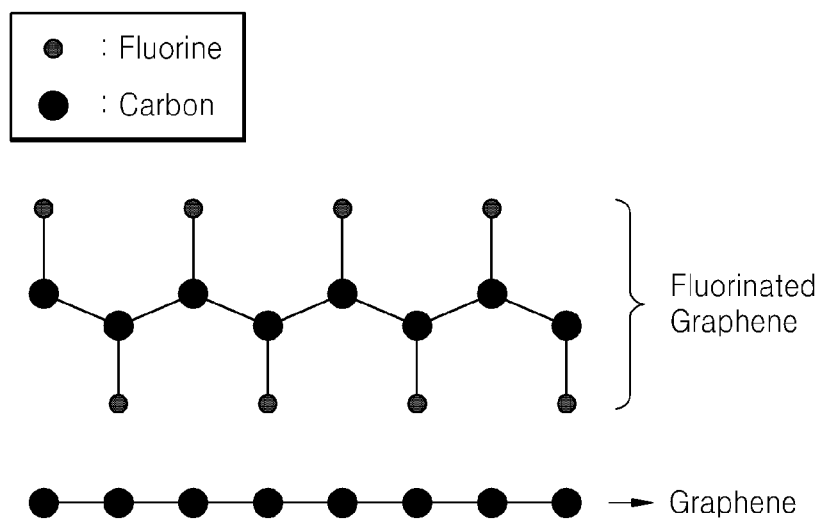

FIGS. 2A and 2B are chemical structure diagrams illustrating atomic structures of graphene and fluorinated graphene.

As illustrated in FIG. 2A, the fluorinated graphene may have a structure in which carbon (C) atoms are combined with fluorine (F) atoms at an upper side of the graphene.

Alternatively, as illustrated in FIG. 2B, the fluorinated graphene may have a structure in which carbon (C) atoms are combined with fluorine (F) atoms at upper and lower sides of the graphene. The graphene of FIGS. 2A and 2B may correspond to the channel layer C10 of FIG. 1, and the fluorinated graphene of FIGS. 2A and 2B may correspond to the gate insulating layer GI10 of FIG. 1.

Referring back to FIG. 1, a gate electrode G10 may be disposed on the gate insulating layer GI10. That is, the gate electrode G10 may be disposed to be opposite to the channel layer C10 with the gate insulating layer GI10 therebetween. A source electrode S10 may be electrically connected to a first region of the channel layer C10, and a drain electrode D10 may be electrically connected to a second region of the channel layer C10. When the gate insulating layer GI10 is disposed on a central portion of the channel layer C10, the source electrode S10 and the drain electrode D10 may be disposed on the channel layer C10 at both sides of the gate insulating layer GI10. The gate electrode G10, the source electrode S10, and the drain electrode D10 each may be formed of a metal or a metal compound. The metal may include a material capable of forming an ohmic contact with graphene (e.g., at least one selected from the group consisting of Au, Cu, Ni, Ti, Pt, Ru, and Pd), and may be formed with a single-layer or multi-layer structure. The multi-layer structure may include, for example, Ti/Au, Pd/Au, and the like. The metal compound may be, for example, a conductive metal oxide or a metal alloy. The gate electrode G10 may include graphene. Because graphene may have excellent conductive characteristics, graphene may be applied as the material of the gate electrode G10. Also, at least one of the source electrode S10 and the drain electrode D10 may include graphene. The source electrode S10 and the drain electrode D10 may be formed of a material that is the same as, or different from, the material of the gate electrode G10.

In the current example embodiment, the channel layer C10 and the gate insulating layer GI10 may be formed from double-layer graphene. That is, a stack structure, which includes the channel layer C10 and the gate insulating layer GI10, may be formed by forming a double-layer graphene including a lower graphene and an upper graphene and then converting the upper graphene into a fluorinated graphene. In this case, the lower graphene may be used as the channel layer C10, and the upper fluorinated graphene may be used as the gate insulating layer GI10. In this manner, because in the current example embodiment a material (fluorinated graphene) converted from the same kind of material (graphene) as the channel layer C10 is used as the material of the gate insulating layer GI10, interface defects between the channel layer C10 and the gate insulating layer GI10 may be prevented, or minimized. In the process of forming the double-layer graphene, a defect may hardly occur between the upper graphene and the lower graphene. In addition, a defect may hardly occur also in the process of selectively converting the upper graphene into an insulation material (a fluorinated graphene). Accordingly, according to the current example embodiment, a transistor (a graphene transistor) in which a defect between the channel layer C10 and the gate insulating layer GI10 is prevented, or minimized, may be implemented. The transistor may have an improved performance and excellent reliability. If a gate insulating layer is formed on a graphene channel layer by depositing a material (e.g., a general dielectric material such as oxide) that is different from that of the graphene channel layer, many defects may occur between the graphene channel layer and the gate insulating layer and due to this, characteristics of a transistor may be deteriorated. However, in the current example embodiment, a defect due to deposition of different kinds of materials may be fundamentally prevented.

Figure 11:
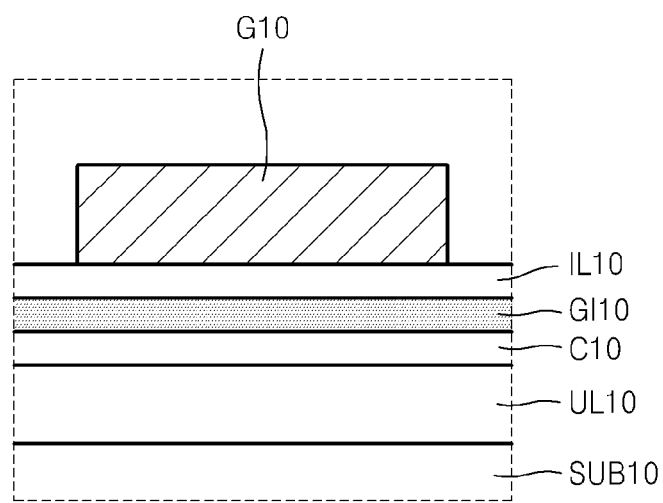

In some cases, an additional insulating layer (not shown in FIG. 1) may be further disposed between the gate insulating layer GI10 and the gate electrode G10, an example of which is illustrated in FIG. 11.

Referring to FIG. 11, an additional insulating layer IL10 may be disposed between the gate insulating layer GI10 and the gate electrode G10. The additional insulating layer IL10 may be a second gate insulating layer. Accordingly, it may be regarded that the gate insulating layer GI10 and the additional insulating layer IL10 constitute a single gate insulating layer. When the additional insulating layer IL10 is disposed, insulation characteristics between the channel layer C10 and the gate electrode GI10 may be improved. The additional insulating layer IL10 may be formed of a material that is different from that of the gate insulating layer GI10. For example, the additional insulating layer IL10 may be formed of silicon oxide, silicon nitride, silicon oxynitride, aluminum oxide, hafnium oxide, insulating polymer, or the like. Any material that is used as a material of a gate insulating layer of a general transistor may be applied as a material of the additional insulating layer IL10. In addition, the additional insulating layer IL10 may have a single-layer or multi-layer structure and for example, may have a thickness in a range of about 3 nm to 50 nm.

Figure 3:
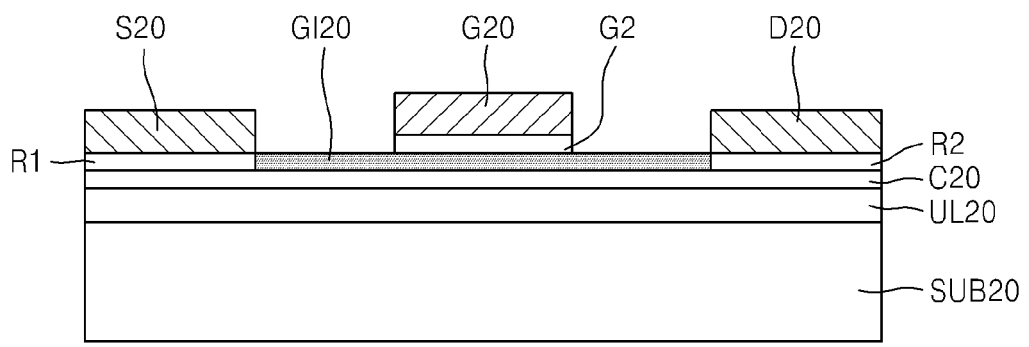

FIG. 3 is a cross-sectional view illustrating a transistor according to another example embodiment.

Referring to FIG. 3, an underlayer UL20 may be disposed on a substrate SUB20, and a channel layer C20 may be disposed on the underlayer UL20. A gate insulating layer GI20 may be disposed on the channel layer C20. The channel layer C20 may include graphene, and the gate insulating layer GI20 may include a material chemically converted from graphene. The material chemically converted from graphene may be fluorinated graphene. The gate insulating layer GI20 may be formed by converting a predetermined (or, alternatively, select) region of the graphene into fluorinated graphene. Accordingly, non-converted regions R1 and R2 (hereinafter, referred to as first and second non-converted regions) that are not converted into fluorinated graphene may exist at both sides of the gate insulating layer GI20. The first and second non-converted regions R1 and R2 may be graphene regions that are not fluorinated. That is, the first and second non-converted regions R1 and R2 may be regarded as first and second graphene regions, respectively. Materials of the substrate SUB20, the underlayer UL20, the channel layer C20, and the gate insulating layer GI20 may be the same as, or similar to, those of the substrate SUB10, the underlayer UL10, the channel layer C10, and the gate insulating layer GI10 of FIG. 1, respectively.

A graphene gate G2 may be disposed on the gate insulating layer GI20. The graphene gate G2 may be formed by patterning a single-layer graphene. That is, the graphene gate G2 may be a single-layer graphene patterned (etched) into a predetermined (or, alternatively, desired) shape. However, in some cases, the graphene gate G2 may have a structure in which several graphene layers are stacked.

A gate electrode G20 may be disposed on the graphene gate G2. A source electrode S20 and a drain electrode D20 may be formed at both sides of the gate electrode G20. The source electrode S20 and the drain electrode D20 may be formed on the first and second non-converted regions (that is, the first and second graphene regions) R1 and R2 at both sides of the gate insulating layer GI20. The source electrode S20 may be electrically connected to the channel layer C20 through the first non-converted region R1, and the drain electrode D20 may be electrically connected to the channel layer C20 through the second non-converted region R2. Materials of the gate electrode G20, the source electrode S20, and the drain electrode D20 may be the same as, or similar to, those of the gate electrode G10, the source electrode S10, and the drain electrode D10 of FIG. 1.

In the current example embodiment, the graphene gate G2 may be regarded as a gate electrode, and the gate electrode G20 may be regarded as a gate pad. Alternatively, it may be regarded that the graphene gate G2 and the gate electrode G20 constitute a single gate electrode. When the graphene gate G2 is used, the gate electrode G20 may not be used. The first and second non-converted regions (that is, the first and second graphene regions) R1 and R2 may be regarded as source and drain regions. The source electrode S20 and the drain electrode D20 may be regarded as a source pad and a drain pad, respectively.

All of the main elements of the transistor according to the current example embodiment may be formed of graphene or a material (for example, fluorinated graphene) converted from graphene. That is, a channel, a gate insulating layer, and a gate may be formed of graphene or a material converted from graphene. In this case, a transistor having a very small thickness may be implemented. In FIG. 3, except for the thicknesses of the gate electrode G20, the source electrode S20, and the drain electrode D20, the thickness of the transistor may correspond to the thickness of three graphene layers. If it is regarded that a transistor is formed by only the channel layer C20, the gate insulating layer GI20, the graphene gate G2, and the non-converted regions (graphene regions) R1 and R2, such a transistor may have a very small thickness.

If necessary, an additional insulating layer (not shown) may be further included between the gate insulating layer GI20 and the graphene gate G2. The additional insulating layer may be a second gate insulating layer. When the additional insulating layer is disposed, insulation characteristics between the gate insulating layer GI20 and the graphene gate G2 may be improved. The material and thickness of the additional insulating layer may be the same as, or similar to, those of the additional insulating layer IL10 described with reference to FIG. 11.

In the example embodiments of FIGS. 1 and 3, each of the channel layers C10 and C20 may have a patterned graphene region. The patterned graphene region may be a region patterned in nanoscale, and for example, may have a nanoribbon or nanomesh structure. A transistor using the patterned graphene region will be described in detail below with reference to FIGS. 4 through 6.

Figure 4:
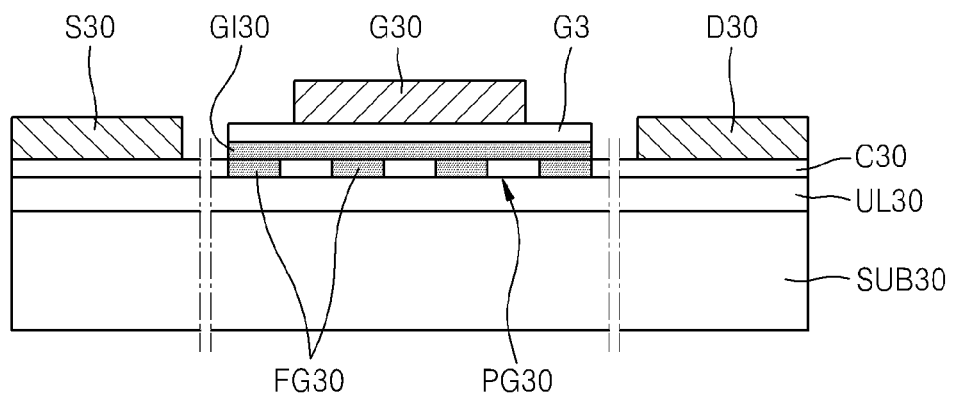

FIG. 4 is a cross-sectional view illustrating a transistor according to yet another example embodiment.

Referring to FIG. 4, an underlayer UL30 may be disposed on a substrate SUB30. A channel layer C30 may be disposed on the underlayer UL30. In some cases, the underlayer UL30 may not be disposed. That is, the channel layer C30 may be directly disposed on the substrate SUB30 without the underlayer UL30 therebetween. The channel layer C30 may include a patterned graphene region PG30. The patterned graphene region PG30 may be a region patterned at nanoscale. In this case, that the patterned graphene region PG30 has a nanoscale may mean that pattern widths of the patterned graphene region PG30 and/or spaces between patterns thereof are in a range of about several nm to several hundred nm. The patterned graphene region PG30 may be defined by a region (hereinafter, referred to as a converted region) FG 30 chemically converted from graphene. In other words, the patterned graphene region PG30 may be defined by forming the converted region FG30, by chemically converting a predetermined (or, alternatively, select) region of graphene. The converted region FG30 may be, for example, a fluorinated graphene region. The patterned graphene region PG30 may be regarded as a non-fluorinated graphene region. The patterned graphene region PG30 may have, for example, a nanoribbon structure or a nanomesh structure, and may be used as a channel region. A plane structure (that is, a top view) of the channel layer C30 including the patterned graphene region PG30 will be described later in detail with reference to FIG. 5.

A gate insulating layer GI30 may be disposed on the patterned graphene region PG30. The gate insulating layer GI30 may include a material (an insulation material) chemically converted from graphene. The material chemically converted from graphene may be fluorinated graphene. For example, the gate insulating layer GI30 may be fluorinated single-layer graphene. However, in some cases, another material other than fluorinated graphene may be used as the gate insulating layer GI30.

A graphene gate G3 may be disposed on the gate insulating layer GI30. The graphene gate G3 may be substantially the same as, or similar to, the graphene gate G2 of FIG. 3. A gate electrode G30 may be disposed on the graphene gate G3, and a source electrode S30 and a drain electrode D30 may be disposed on the channel layer C30 at both sides of the gate electrode G30. The gate electrode G30, the source electrode S30, and the drain electrode D30 may be substantially the same as, or similar to, the gate electrode G20, the source electrode S20, and the drain electrode D20, illustrated in FIG. 2, respectively. In some cases, only the graphene gate G3 may be used, and the gate electrode G30 may not be used. Alternatively, the graphene gate G3 may not be used, and only gate electrode G30 may be used.

In some cases, an additional insulating layer (not shown) may be further disposed between the gate insulating layer GI30 and the graphene gate G3. The additional insulating layer may be a second gate insulating layer. When the additional insulating layer is disposed, insulation characteristics between the gate insulating layer GI30 and the graphene gate G3 may be improved. The material and thickness of the additional insulating layer may be the same as, or similar to, those of the additional insulating layer IL10 described with reference to FIG. 11.

Figure 5:
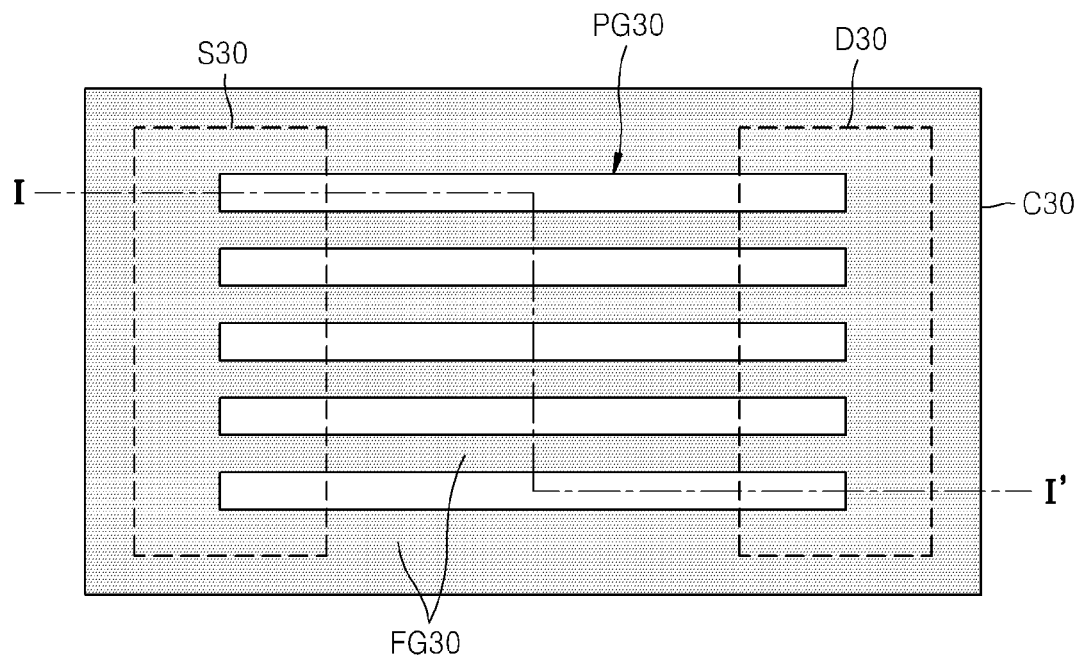

FIG. 5 is a plan view exemplarily showing a plane structure of main elements of the transistor illustrated in FIG. 4.

A cross-sectional view taken along line I-I' of FIG. 5 may be the same as shown in FIG. 4. For convenience, the gate insulating layer GI30, the graphene gate G3, and the gate electrode G30 are not illustrated in FIG. 5.

Referring to FIG. 5, the channel layer C30 may include the patterned graphene region PG30 defined by a region FG30 (hereinafter, referred to as a converted region) chemically converted from graphene. The converted region FG30 may be a fluorinated graphene region. The patterned graphene region PG30 may have a graphene nanoribbon (GNR) structure. Graphene nanoribbon (GNR) indicates a graphene region patterned so as to have a stripe pattern. The patterned graphene region PG30 may have a large bandgap compared to a non-patterned graphene sheet. The more the width of a pattern of the patterned graphene region PG30 is decreased, the larger the bandgap thereof may be increased. Accordingly, the transistor according to the current example embodiment, which uses the patterned graphene region PG30 as a channel region, may have excellent operational characteristics. For example, the transistor according to the current example embodiment may have a high ON/OFF current ratio. In addition, because the bandgap may be adjusted by controlling a pattern width of the patterned graphene region PG30, controlling characteristics of the transistor may be easy.

The source electrode S30 may be disposed to be connected to one end of the patterned graphene region PG30, and the drain electrode D30 may be disposed to be connected to the other end of the patterned graphene region PG30. The gate insulating layer GI30 of FIG. 4 and the graphene gate G3 of FIG. 4 may be disposed on the patterned graphene region PG30 between the source electrode S30 and the drain electrode D30, and the gate electrode G30 of FIG. 4 may be disposed on the graphene gate G3 of FIG. 4.

The form of the patterned graphene region PG30 may be variously changed. For example, the patterned graphene region PG30 may have a nanomesh structure, an example of which is illustrated in FIG. 6.

Figure 6:
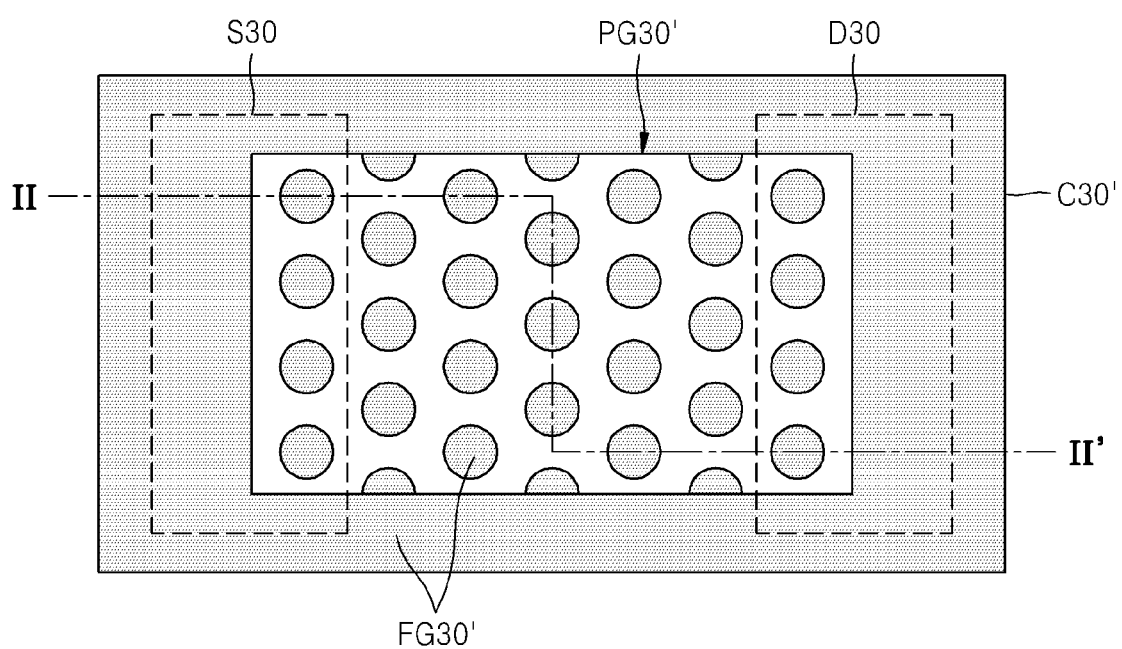

Referring to FIG. 6, a channel layer C30' may include a patterned graphene region PG30' defined by a region FG30' (for example, a fluorinated graphene region) chemically converted from graphene. The patterned graphene region PG30' may have a graphene nanomesh (GNM) structure. The GNM structure indicates a graphene region patterned in a mesh form. The patterned graphene region PG30' may have a large bandgap compared to a non-patterned graphene sheet, and thus, the transistor according to the current example embodiment may have excellent operational characteristics. A cross-sectional view taken along line II-II' in FIG. 6 may be similar to FIG. 4.

As described with reference to FIGS. 4 through 6, in the above example embodiments, the patterned graphene regions PG30 and PG30' may be defined by using the regions FG30 and FG30' chemically converted from graphene. That is, the patterned graphene regions PG30 and PG30' may be formed by chemically converting a predetermined (or, alternatively, select) region of graphene. When patterning graphene by etching the graphene, the graphene may be damaged by the etching and other material layers may also be damaged. However, because in example embodiments the patterned graphene regions PG30 and PG30' are formed with a chemical conversion method instead of etching, problems due to etching may be fundamentally prevented.

FIGS. 7A through 7E are cross-sectional views illustrating a method of manufacturing a transistor, according to an example embodiment.

Figure 7A:
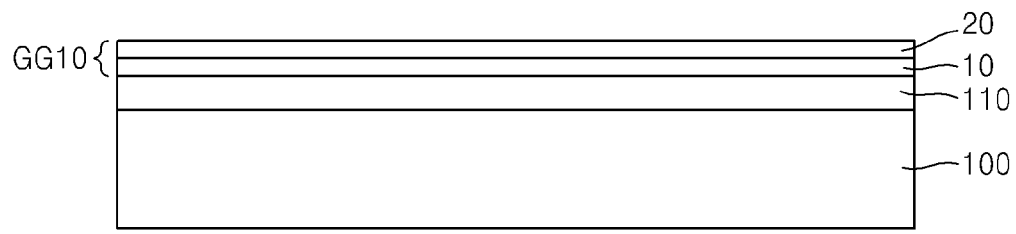
FIGS. 7A through 7E are cross-sectional views illustrating a method of manufacturing a transistor, according to an example embodiment.

Referring to FIG. 7A, a multi-layer graphene GG10 may be formed on a substrate 100. The multi-layer graphene GG10 may include a first graphene 10 and a second graphene 20. That is, the multi-layer graphene GG10 may be a double-layer graphene. The multi-layer graphene GG10 may be grown on another substrate (not shown) and then be transferred onto the substrate 100.

A method of growing the multi-layer graphene GG10 on another substrate (not shown) is as follows. Graphene may be grown on a metal catalytic layer (not shown) by using a chemical vapor deposition (CVD) method using a source gas (e.g., $CH_4$, $C_2H_2$, $C_2H_4$, CO, etc.) including carbon at a temperature from about 700° C. to about 1100° C. The metal catalytic layer may be a layer formed on the other substrate, and in some cases, the metal catalytic layer itself may be used as the other substrate. Ni, Cu, Co, Pt, Ru, or the like may be used as the material of the metal catalytic layer, and a multi-layer film including at least two of Ni, Cu, Co, Pt, Ru, or the like may be used as the metal catalytic layer. When growing graphene on a SiC substrate by using a pyrolysis method, graphene may be directly grown on the SiC substrate without using the metal catalytic layer. Graphene may be grown as a monolayer graphene, a double-layer graphene, or a few-layer graphene according to growth conditions. In the current example embodiment, a double-layer graphene may be used. In this manner, the multi-layer graphene GG10 may be grown on another substrate (not shown), and may be transferred onto the substrate 100. A general graphene transferring method may be used as a method of transferring the multi-layer graphene GG10, and thus a detailed description of the method is omitted.

An underlayer 110 may be formed on the substrate 100, and the multi-layer graphene GG10 may be formed (transferred) on the underlayer 110. For example, when the substrate 100 is a silicon substrate, the underlayer 110 may be a silicon oxide layer. However, the material of the substrate 100 and the material of the underlayer 110 may be variously changed. In some cases, the underlayer 110 may not be formed.

Figure 7B:
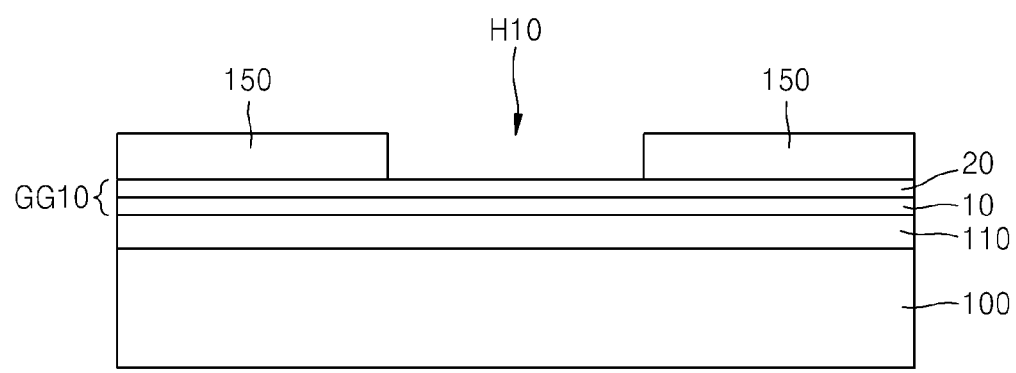

Referring to FIG. 7B, a mask pattern 150 having an opening H10 may be formed on the second graphene 20. The mask pattern 150 may be formed of a metal material. For example, the mask pattern 150 may be formed of a metal material that is easily oxidized, such as Al, Zn, or the like. The metal material for forming the mask pattern 150 may be deposited by using a sputtering method. In addition, the mask pattern 150 may be formed by using a lift-off process. The mask pattern 150 functions as a mask for a fluorination process of the second graphene 20 and may also be used for removing a portion of the second graphene 20 under the mask pattern 150. To easily achieve the above latter purpose, the mask pattern 150 may be formed by using the material and method described above. This will be described in more detail later.

Figure 7C:
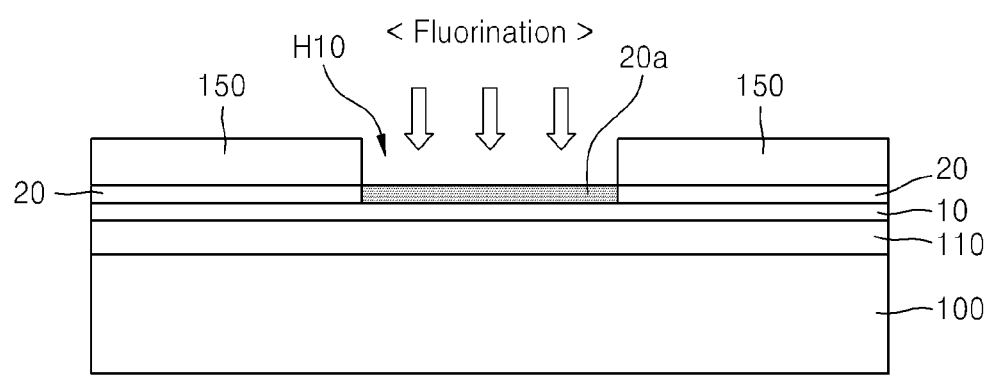

Referring to FIG. 7C, a region of the second graphene 20, exposed by the opening H10, may be changed into a fluorinated graphene 20a. For example, the region of the second graphene 20, exposed by the opening H10, may be treated (processed) with $XeF_2$, and thus may be changed into the fluorinated graphene 20a. The $XeF_2$ treatment may be performed at room temperature, or a temperature similar to room temperature. In other words, by exposing the region of the second graphene 20 of the opening H10 to $XeF_2$ gas at room temperature or a temperature similar to room temperature, the exposed region of the second graphene 20 may be changed into the fluorinated graphene 20a. Because the first graphene 10 in the opening H10 is covered with the second graphene 20, the first graphene 10 is not fluorinated and may maintain intrinsic physical properties and characteristics of graphene. Accordingly, only an exposed region of an upper graphene (that is, the second graphene 20) of the two graphenes, namely, the first and second graphenes 10 and 20, may be selectively fluorinated. A method of forming the fluorinated graphene 20a (i.e., a method of converting the region of the second graphene 20), exposed by the opening H10, into the fluorinated graphene 20a is not limited to the method described above, and may be variously changed. For example, the fluorinated graphene 20a may be formed through a thermal fluorination process. The thermal fluorination process may be performed by using fluorine ($F_2$) gas at a temperature in a range of about 500° C. to about 600° C. That is, by exposing the region of the second graphene 20 in the opening H10 to $F_2$ gas at a temperature in a range of about 500° C. to about 600° C., the region may be changed into the fluorinated graphene 20a. Besides, by using various methods, the region of the second graphene 20 in the opening H10 may be changed into the fluorinated graphene 20a. Because the fluorinated graphene 20a converted from graphene through the method described above has insulation characteristics, the fluorinated graphene 20a may be used as a gate insulating layer. Hereinafter, the fluorinated graphene 20a is referred to a gate insulating layer. The first graphene 10 under the gate insulating layer 20a may be used as a channel layer.

Figure 7D:
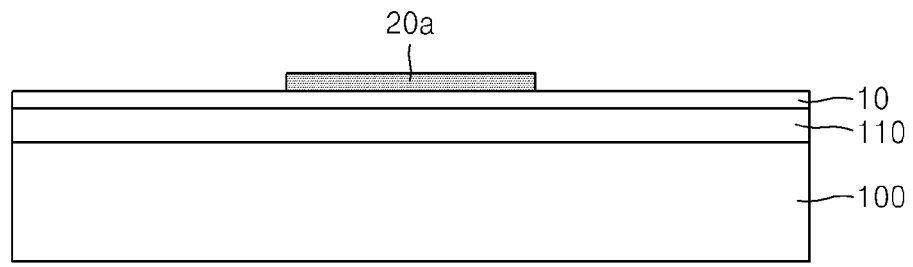

Next, the mask pattern 150 and a portion of the second graphene 20 under the mask pattern 150 may be removed. The mask pattern 150 may be removed by using a wet etching method using a predetermined (or, alternatively, select) etchant (for example, an acid etchant), and the portion of the second graphene 20 under the mask pattern 150 may also be removed when the mask pattern 150 is removed. As a result, a structure as illustrated in FIG. 7D may be obtained.

A process of removing the mask pattern 150 and the portion of the second graphene 20 under the mask pattern 150 is described in more detail as follows. When forming the mask pattern 150 in a predetermined (or, alternatively, desired) condition in the process of FIG. 7B, because a bonding strength (an adhesive strength) between the mask pattern 150 and the second graphene 20 strengthens, the mask pattern 150 and the portion of the second graphene 20 under the mask pattern 150 may be removed together in a process of removing the mask pattern 150. That is, when forming the mask pattern 150 with a predetermined (or, alternatively, select) metal film by using a sputtering method, defects may occur in the second graphene 20 during a sputtering process. Then, oxygen combines with the defects, and thus, a portion of the metal film is oxidized, and consequently, a bonding strength (an adhesive strength) between the second graphene 20 and the metal film (that is, the mask pattern 150) may increase. Accordingly, in the process of removing the mask pattern 150, a portion of the second graphene 20, which contacts the mask pattern 150, may be easily removed. For the reason stated above, the mask pattern 150 may be formed through a sputtering method by using a metal that is easily oxidized (e.g., Al or Zn). When forming the mask pattern 150 in the process of FIG. 7B, because a region of the second graphene 20, which corresponds to the opening H10, may be covered with a photosensitive (photoresist) film, the region of the second graphene 20 may not be damaged by sputtering. When removing the mask pattern 150 and the portion of the second graphene 20 under the mask pattern 150, the first graphene 10 may be maintained without being removed or damaged because a bonding strength (an adhesive strength) between the first graphene 10 and the second graphene 20 is relatively weak. The method of forming the mask pattern 150 and the method of removing the second graphene 20 by using the mask pattern 150 described above are exemplary, and the methods may be variously changed.

Figure 7E:
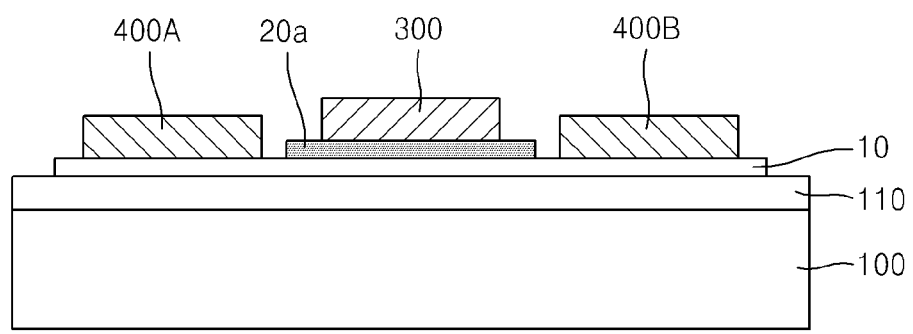

Referring to FIG. 7E, a gate electrode 300 may be formed on the gate insulating layer 20*a*. A source electrode 400A and a drain electrode 400B may be formed on the first graphene 10 (that is, a channel layer) at both sides of the gate electrode 300. The gate electrode 300, the source electrode 400A, and the drain electrode 400B may or may not be formed at the same time. In the latter case, the source and drain electrodes 400A and 400B may be formed after forming the gate electrode 300, or vice versa. The gate electrode 300, the source electrode 400A, and the drain electrode 400B each may be formed of a metal or a metal compound. The metal may include a metal capable of forming an ohmic contact with graphene, for example, at least one selected from the group consisting of Au, Cu, Ni, Ti, Pt, Ru, and Pd, and may be formed with a single-layer or multi-layer structure. The multi-layer structure may include, for example, Ti/Au, Pd/Au, and the like. The metal compound may be, for example, a conductive metal oxide or a metal alloy. The gate electrode 300 may include graphene. Also, at least one of the source electrode 400A and the drain electrode 400B may include graphene. The source electrode 400A and the drain electrode 400B may be formed of a material that is the same as, or different from, the material of the gate electrode 300.

Because the first graphene 10 may be weak with respect to plasma, a deposition method that does not use plasma, for example, an evaporation method, may be used when forming the gate electrode 300, the source electrode 400A, and the drain electrode 400B. In addition, a method that does not use plasma, for example, a wet etch or lift-off process, may be used also in a patterning process for forming the gate electrode 300, the source electrode 400A, and the drain electrode 400B.

In addition, in the current example embodiment, an additional insulating layer (not shown) may be further formed between the gate insulating layer 20*a* and the gate electrode 300. The additional insulating layer may be a second gate insulating layer. When the additional insulating layer is formed, insulation characteristics between the gate electrode 300 and the first graphene 10 (that is, a channel layer) may be improved. After forming the source electrode 400A and the drain electrode 400B, the additional insulating layer may be formed to cover the gate insulating layer 20*a*, source electrode 400A, and drain electrode 400B. Next, the gate electrode 300 may be formed on the additional insulating layer. The additional insulating layer may be formed of silicon oxide, silicon nitride, silicon oxynitride, aluminum oxide, hafnium oxide, insulating polymer, or the like. In addition, the additional insulating layer may have a single-layer or multi-layer structure and for example, may have a thickness in a range of about 3 nm to about 50 nm. Any material that is used as a material of a gate insulating layer of a general transistor may be applied as a material of the additional insulating layer. When forming the additional insulating layer, a process that does not use plasma which may damage the first graphene 10 (e.g., thermal atomic layer deposition (ALD), thermal chemical vapor deposition (CVD), evaporation, or the like) may be used. A temperature that is used for forming the additional insulating layer may be in a range of about 100° C. to about 400° C.

In the current example embodiment, the first graphene layer 10 (that is, channel layer) and the gate insulating layer 20*a* may be formed from a double-layer graphene. That is, after forming a double-layer graphene (that is, the multi-layer graphene GG10) including the first graphene 10 and the second graphene 20 (refer to FIG. 7A), a stack structure, which includes the first graphene layer 10 and the gate insulating layer 20*a*, may be formed by converting a portion of the second graphene 20 into a fluorinated graphene 20*a* (refer to FIG. 7C).

In this manner, because in the current example embodiment a material (a fluorinated graphene) converted from the same kind of material (graphene) as the first graphene 10 (that is, the channel layer) is used as the material of the gate insulating layer 20*a*, interface defects between the channel layer 10 and the gate insulating layer 20*a* may be prevented or minimized. Accordingly, according to the current example embodiment, a transistor (a graphene transistor) in which defects between the channel layer 10 and the gate insulating layer 20*a* are prevented or minimized may be implemented. The transistor may have an improved performance and excellent reliability. If a gate insulating layer is formed on a graphene channel layer by depositing a material (for example, a general dielectric material such as oxide) that is different from that of the graphene channel layer, many defects may occur between the graphene channel layer and the gate insulating layer and due to the defects, characteristics of a transistor may be deteriorated. However, in the current example embodiment, defects due to deposition of different kinds of materials may be fundamentally prevented.

A method of forming a structure illustrated in FIG. 7D may be changed, an example of which is illustrated in FIGS. 8A through 8D.

FIGS. 8*a* through 8D illustrate a method of manufacturing a transistor, according to another example embodiment.

Figure 8A:
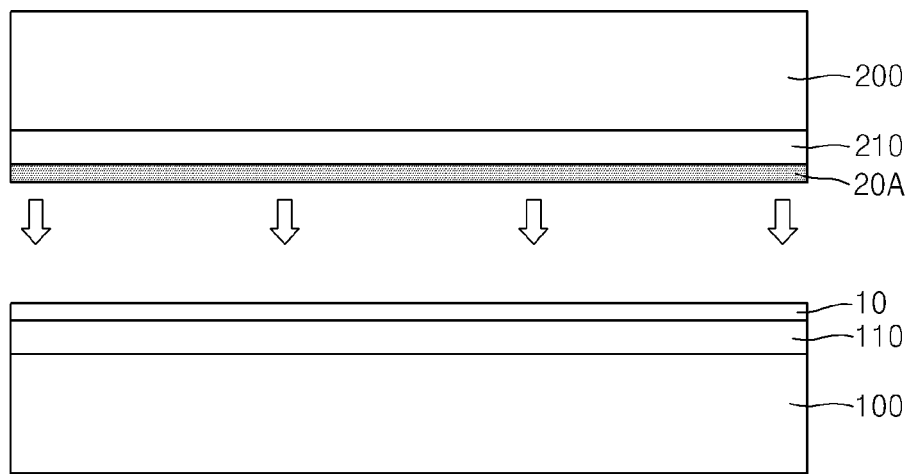
FIGS. 8A through 8D are cross-sectional views illustrating a method of manufacturing a transistor, according to another example embodiment.

Referring to FIG. 8A, a first graphene 10 may be formed on a substrate 100 (hereinafter, referred to as a first substrate). The first graphene 10 may be grown on another substrate (not shown) and then transferred onto the first substrate 100. An underlayer 110 (hereinafter, a first underlayer) may be formed between the first substrate 100 and the first graphene 10.

Next, a fluorinated graphene 20A formed on a second substrate 200 may be transferred onto the first graphene 10. The fluorinated graphene 20A may be formed by converting graphene on the second substrate 200 through a fluorination process. Alternatively, the fluorinated graphene 20A may be formed on another substrate (not shown) and then may be attached to the second substrate 200. The second substrate 200 may be a handling substrate and may have a flexible property. A second underlayer 210 may be formed between the second substrate 200 and the fluorinated graphene 20A. The second underlayer 210 may be, for example, a polymer layer. However, the materials and characteristics of the second substrate 200 and the second underlayer 210 are not limited to those described above and may differ.

Figure 8B:
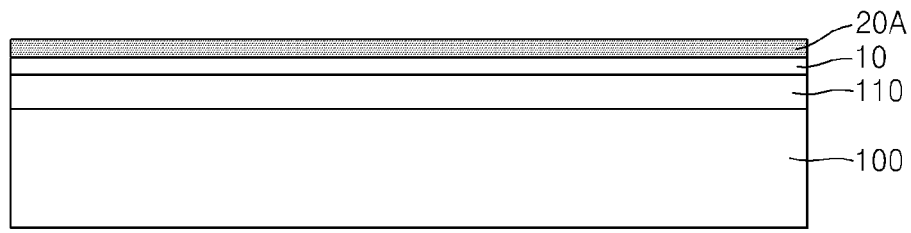

FIG. 8B illustrates a resultant structure in which the fluorinated graphene 20A of the second substrate 200 has been transferred onto the first graphene 10. A method of transferring the fluorinated graphene 20A onto the first graphene 10 may be substantially the same as, or similar to, a general method of transferring graphene.

Figure 8C:
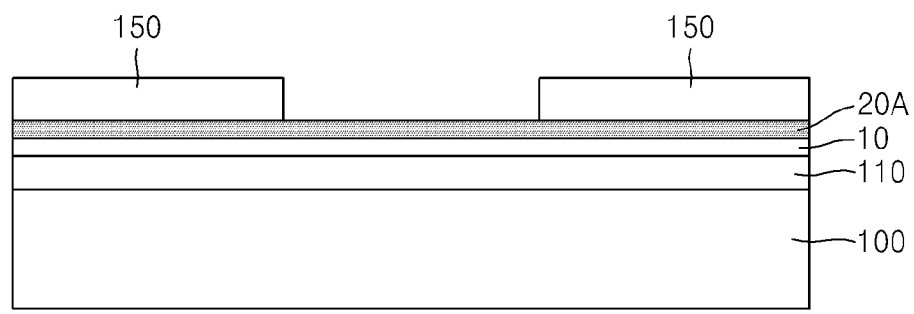

Referring to FIG. 8C, a mask pattern 150 may be formed on the fluorinated graphene 20A. The mask pattern 150 may be formed with the same method and the same material as the mask pattern 150 of FIG. 7B.

Figure 8D:
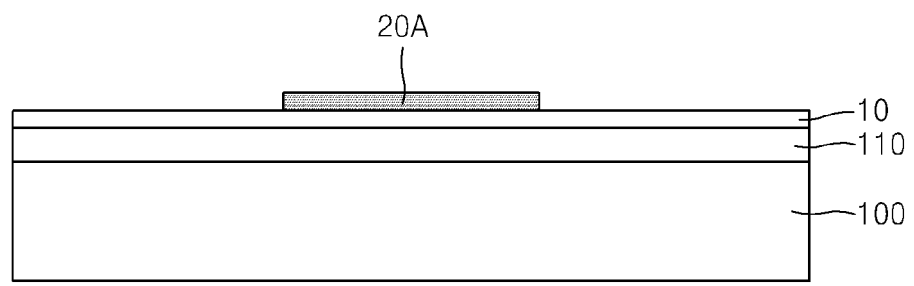

Next, the mask pattern 150 and a portion of the fluorinated graphene 20A under the mask pattern 150 may be removed. A method of removing the mask pattern 150 and a portion of the fluorinated graphene 20A under the mask pattern 150 may be the same as, or similar to, the method of removing the mask pattern 150 and a portion of the second graphene 20 under the mask pattern 150, described with reference to FIGS. 7C and 7D. FIG. 8D illustrates a resultant structure in which the mask pattern 150 and the portion of the fluorinated graphene 20A under the mask pattern 150 have been removed in the structure of FIG. 8C. The structure of FIG. 8D may be substantially the same as, or similar to, that of FIG. 7D.

Then, a transistor similar to that of FIG. 7E may be manufactured by forming a gate electrode, a source electrode, and a drain electrode on the structure of FIG. 8D.

FIGS. 9A through 9E are cross-sectional views illustrating a method of manufacturing a transistor, according to yet another example embodiment.

Figure 9A:
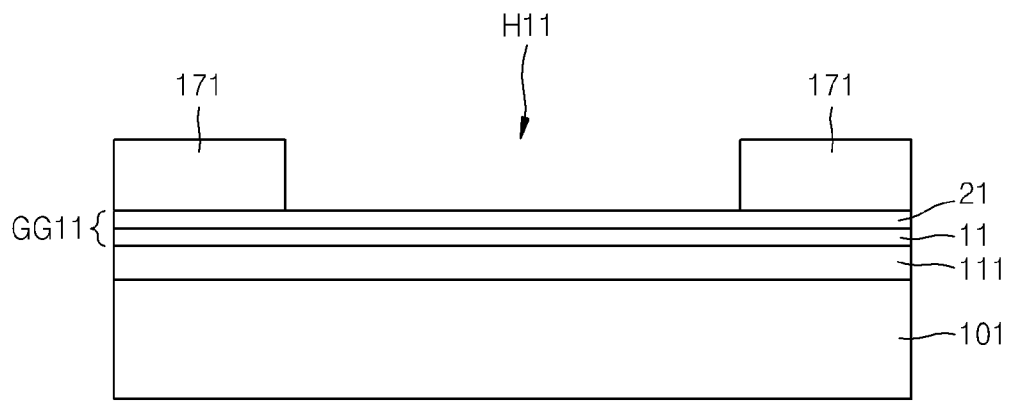
FIGS. 9A through 9E are cross-sectional views illustrating a method of manufacturing a transistor, according to yet another example embodiment.

Referring to FIG. 9A, a multi-layer graphene GG11 may be formed on a substrate 101. An underlayer 111 may be formed on the substrate 101, and then the multi-layer graphene GG11 may formed on the underlayer 111. The multi-layer graphene GG11 may be formed on another substrate (not shown) and then may be transferred onto the substrate 101. The multi-layer graphene GG11 may include at least two graphenes, for example, a first graphene 11 and a second graphene 21. When the multi-layer graphene GG11 includes two graphenes, namely, the first and second graphenes 11 and 21, the multi-layer graphene GG11 may be regarded as a double-layer graphene. A method of forming (transferring) the multi-layer graphene GG11 on the substrate 101 may be substantially the same as, or similar to, the method of forming (transferring) the multi-layer graphene GG10 on the substrate 100 of FIG. 7A. In some cases, the multi-layer graphene GG11 may include three layers or more.

Next, a mask pattern 171 having an opening H11 may be formed on the second graphene 21. The mask pattern 150 may be formed of, for example, a photosensitive (photoresist) material. Alternatively, the mask pattern 171 may be formed of oxide, nitride, or the like.

Figure 9B:
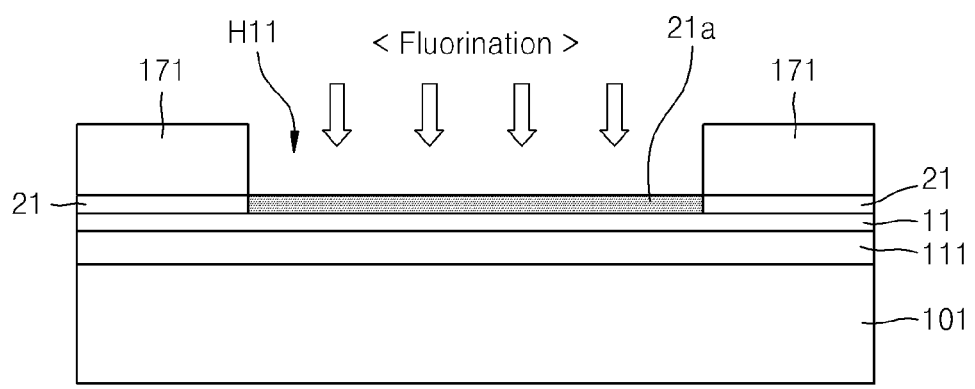

Referring to FIG. 9B, a portion of the second graphene 21, exposed by the opening H11, may be changed into a fluorinated graphene 21a. A method of changing the portion of the second graphene 21 into the fluorinated graphene 21a may be the same as, or similar to, the method of forming the fluorinated graphene 20a, described with reference to FIG. 7C. Hereinafter, the fluorinated graphene 21a is referred to as a gate insulating layer. The first graphene 11 under the gate insulating layer 21a may be a channel layer.

Figure 9C:
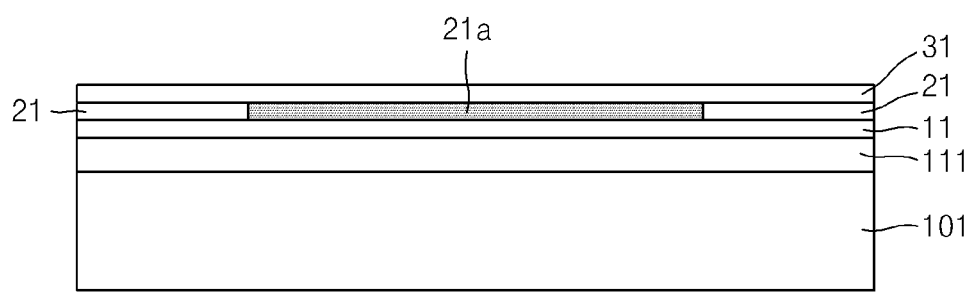

Next, after removing the mask pattern 171, as illustrated in FIG. 9C, a third graphene 31 may be formed on the second graphene 21. The third graphene 31 may be transferred onto the second graphene 21 by using a general method of transferring graphene.

Figure 9D:
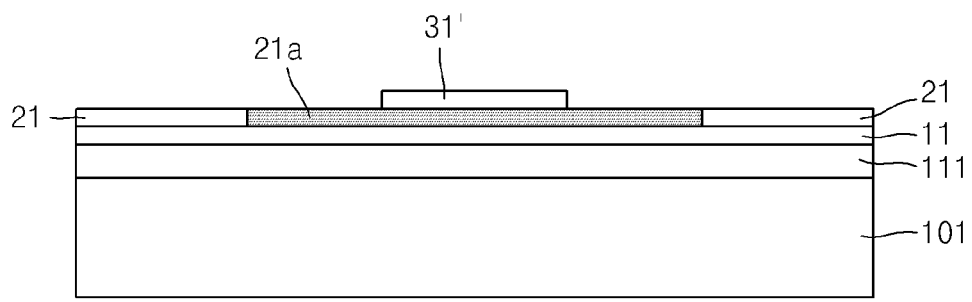

As illustrated in FIG. 9D, a graphene gate 31' may be formed by patterning the third graphene 31. A method of patterning the third graphene 31 may be the same as, or similar to, the method of patterning the second graphene 20, described with reference to FIGS. 7C and 7D.

Figure 9E:
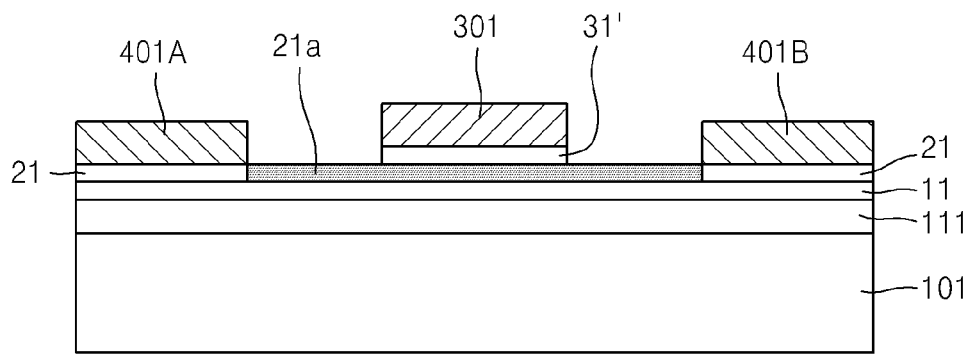

Referring to FIG. 9E, a gate electrode 301 may be formed on the graphene gate 31'. A source electrode 401A and a drain electrode 401B may be formed on the second graphene 21 at both sides of the gate insulating layer 21a. The gate electrode 301, the source electrode 401A, and the drain electrode 401B may be formed by using a lift-off process. The source electrode 401A and the drain electrode 401B may be electrically connected to the first graphene 11 (that is, a channel layer) through the second graphene 21. Although FIG. 9E illustrates the case where the gate electrode 301 has the same width as the graphene gate 31', the gate electrode 301 may be formed to have a wider width than the graphene gate 31'. In other words, the gate electrode 301 may have a structure in which the gate electrode 301 extends on the gate insulating layer 21a at both sides of the graphene gate 31'. In addition, the source electrode 401A and the drain electrode 401B also may have a structure in which they extend on a portion of the gate insulating layer 21a adjacent thereto.

The method according to the current example embodiment may also be also applied to a multi-layer graphene (i.e., a few-layer graphene) having two layers or more. That is, in the process of FIG. 9A, a structure in which three or more graphene layers are stacked may be used as the multi-layer graphene GG11. In addition, the method may be easily applied to a substrate with a wafer scale. For example, the method according to the current example embodiment may be applied to a substrate (for example, a silicon substrate) having a diameter of 300 mm or more. Accordingly, the method may improve the productivity of a transistor and may reduce manufacturing costs.

All main elements of the transistor manufactured according to the current example embodiment may be formed of graphene or a material (fluorinated graphene) converted from the graphene. That is, a channel, a gate insulating layer, and a gate may be formed of graphene or a material converted from the graphene. In this case, a transistor having a very small thickness may be implemented. In FIG. 9E, except for the thicknesses of the gate electrode 301, the source electrode 401A, and the drain electrode 401B, the thickness of the transistor may be correspond to the thickness of three graphene layers. If a transistor is constituted by only the channel layer 11, the gate insulating layer 21a, the graphene gate 31', and the second graphene region 21, such a transistor may have a very small thickness.

The method of FIG. 9A through 9E may be variously modified, and for example, an additional insulating layer (a second gate insulation layer) (not shown) may be further formed between the gate insulating layer 21a and the graphene gate 31'. That is, in the process of FIG. 9C, before forming (transferring) the third graphene 31 on the second graphene 21 and the gate insulating layer 21a, an additional insulating layer may be formed on the second graphene 21 and the gate insulating layer 21a. After forming the additional insulating layer, the third graphene 31 may be formed (transferred) on the additional insulating layer, and the graphene gate 31' may be formed by patterning the third graphene 31. When the additional insulating layer is further formed, insulation characteristics between the graphene gate 31' and the first graphene 11 (that is, a channel layer) may be improved.

The material and thickness of the additional insulating layer may be the same as, or similar to, those of the additional insulating layer described with reference to FIG. 7E.

Figure 10A:
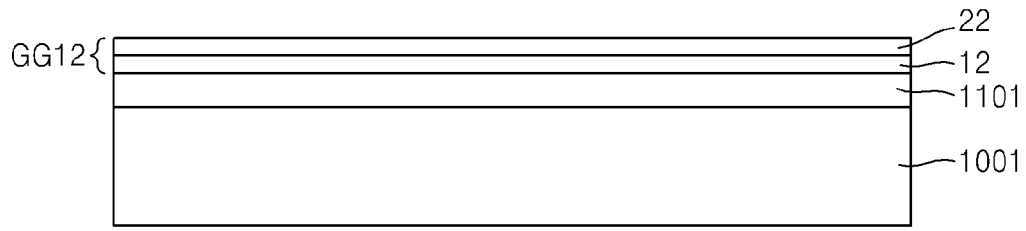
FIGS. 10A through 10P are cross-sectional views illustrating a method of manufacturing a transistor, according to a further example embodiment.
Figure 10B:
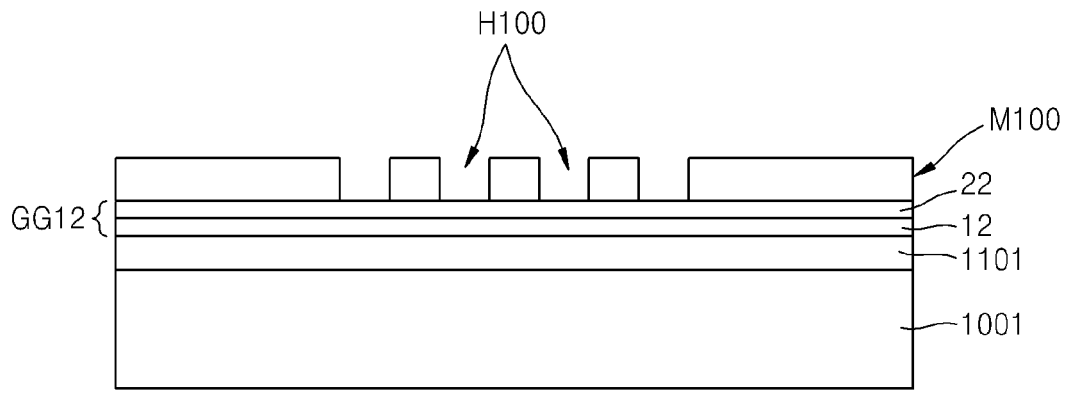
Figure 10C:
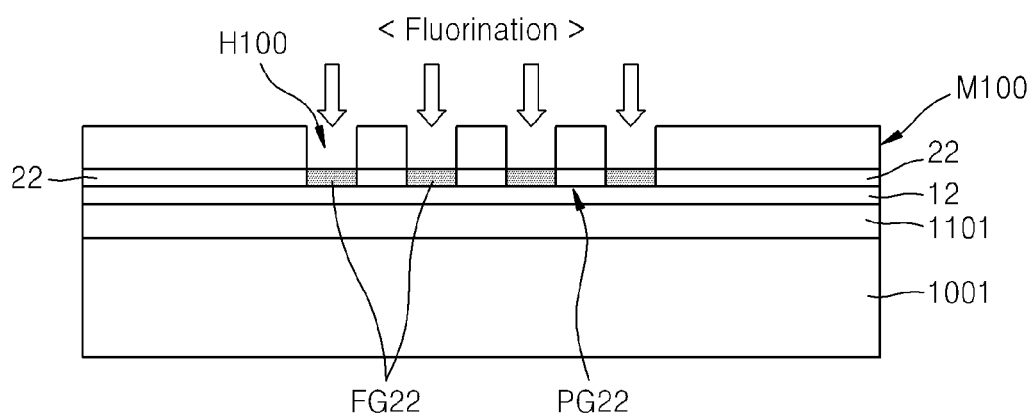
Figure 10D:
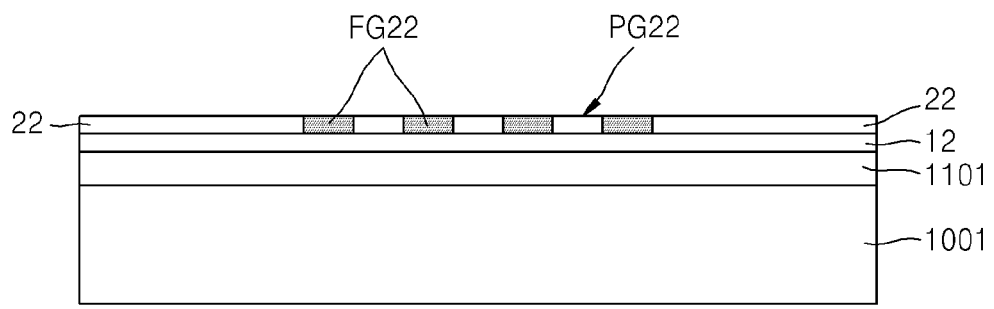
Figure 10E:
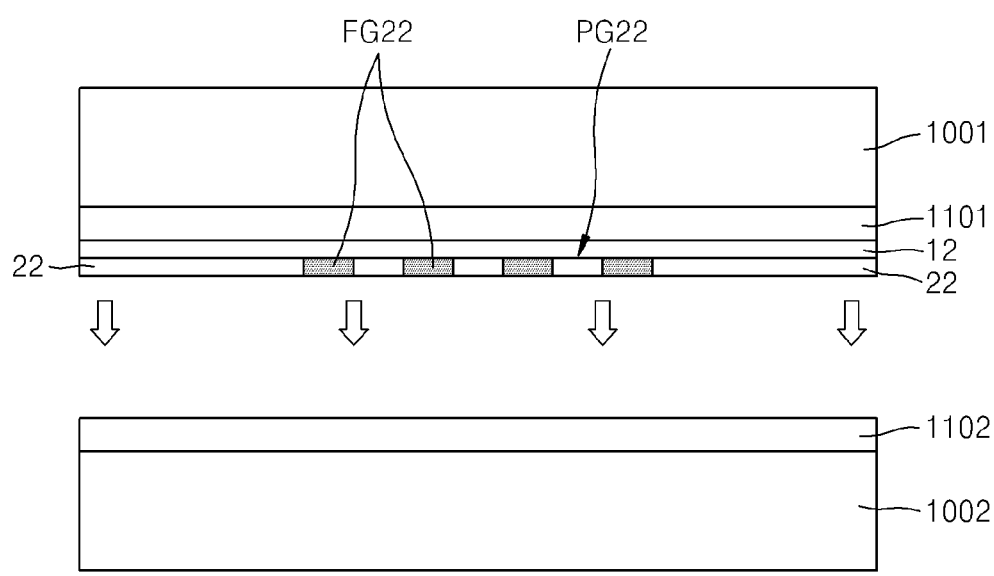
Figure 10F:
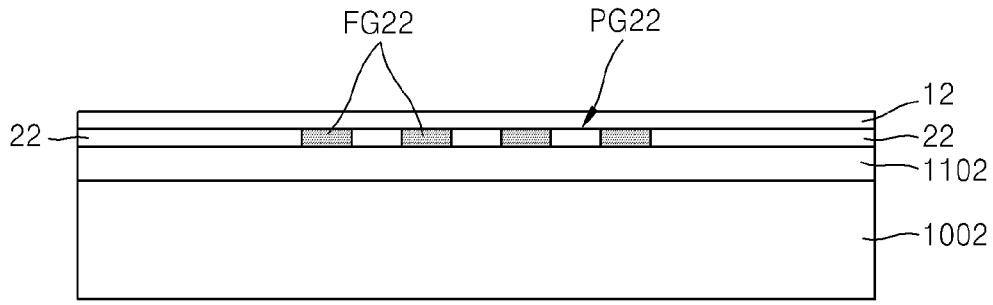
Figure 10G:
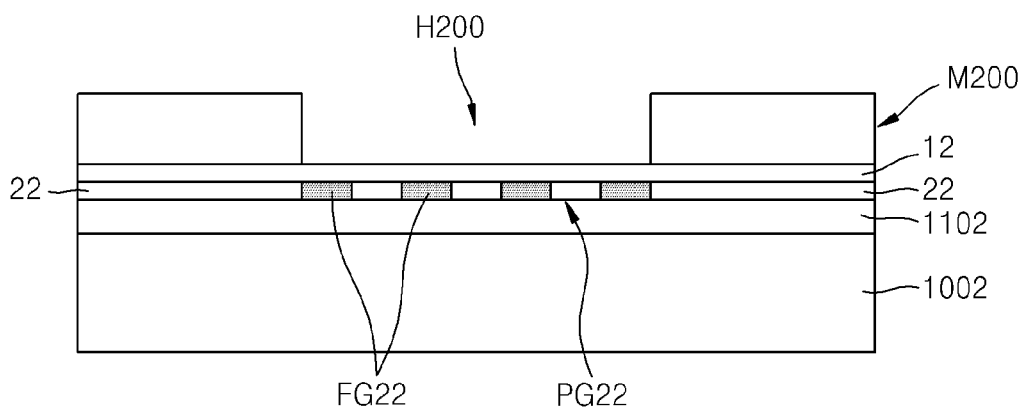
Figure 10H:
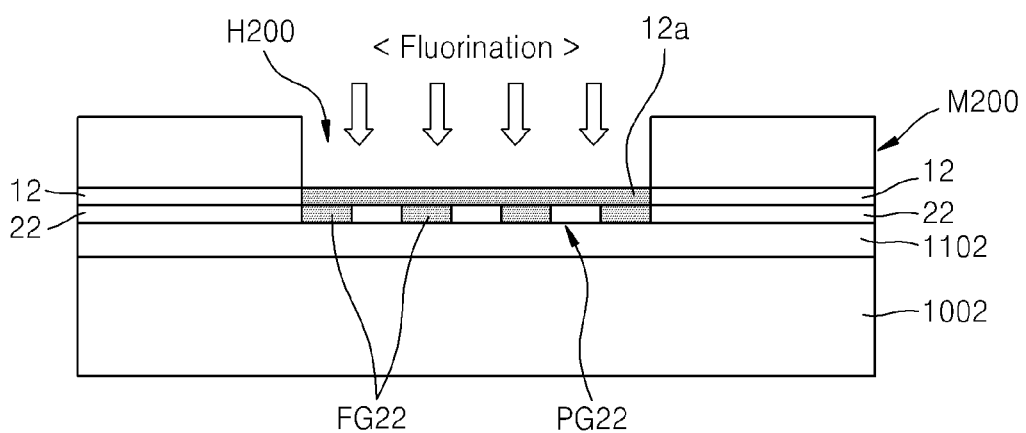
Figure 10I:
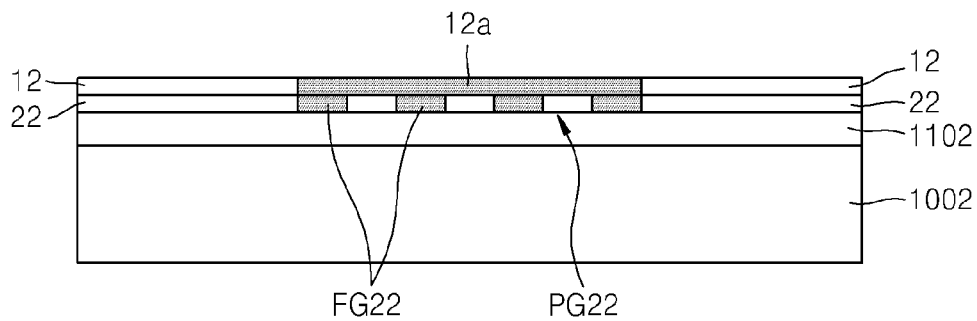
Figure 10J:
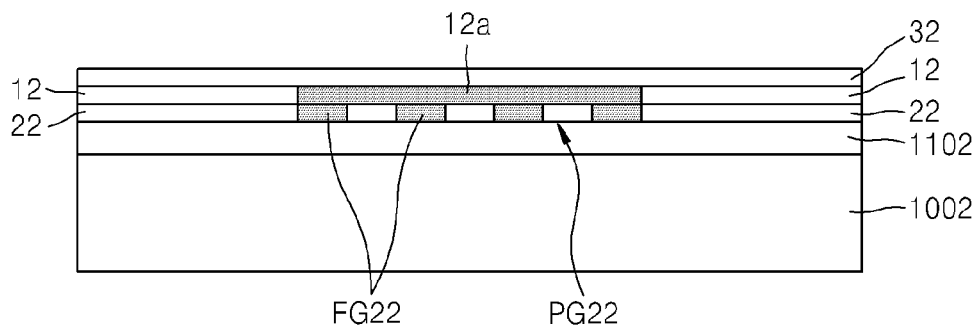
Figure 10K:
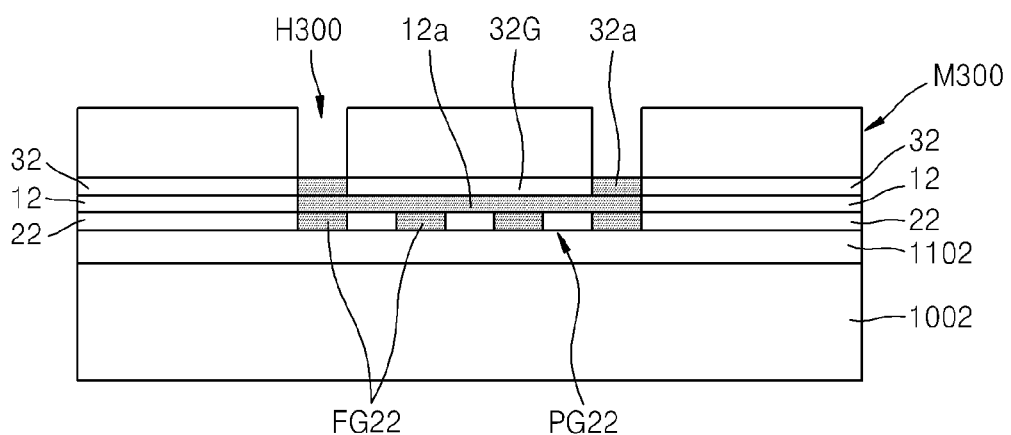
Figure 10L:
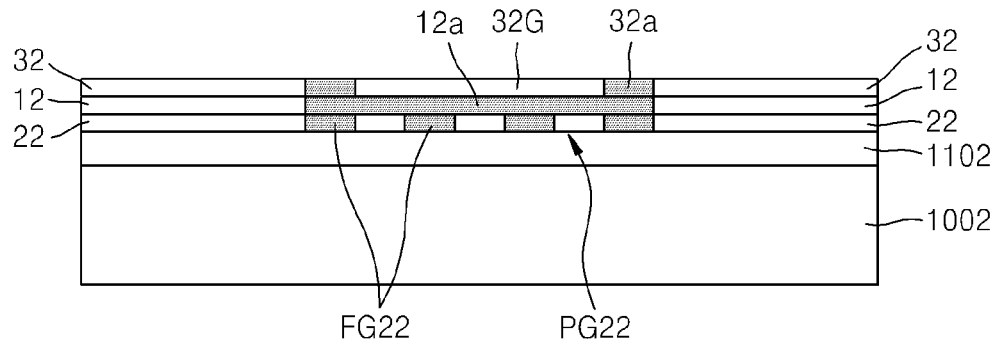
Figure 10M:
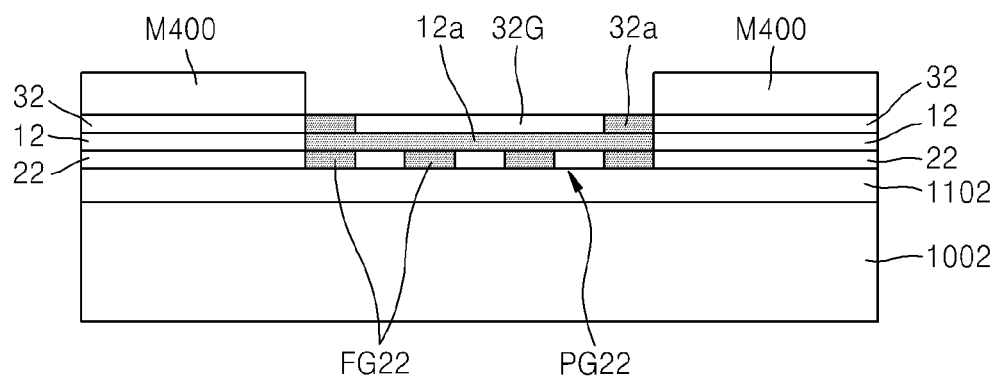
Figure 10N:
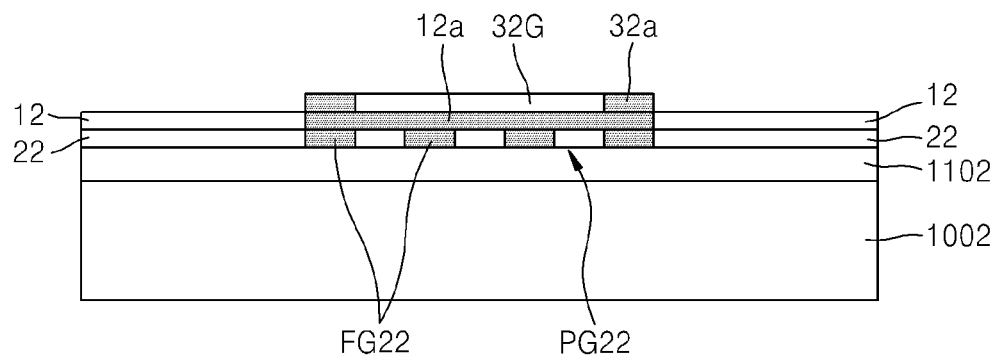
Figure 10O:
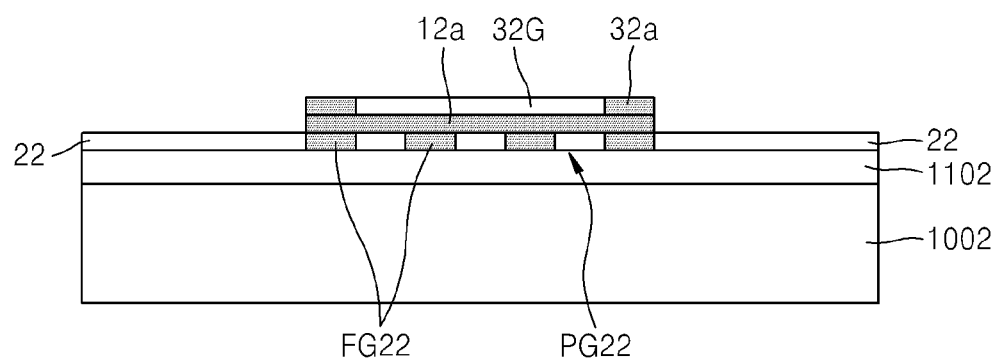
Figure 10P:
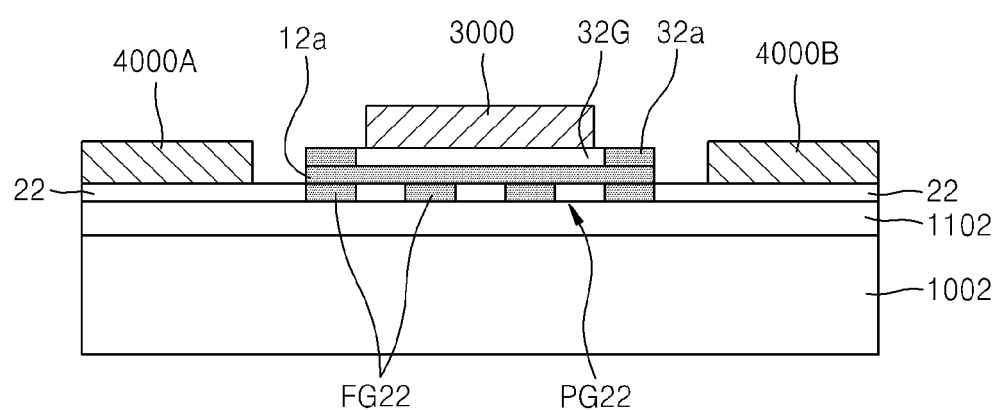

FIGS. 10A through 10P are cross-sectional views illustrating a method of manufacturing a transistor, according to a further example embodiment.

Referring to FIG. 10A, a multi-layer graphene GG12 may be formed on a substrate 1001. A first underlayer 1101 may be formed between the substrate 1001 and the multi-layer graphene GG12. For example, the multi-layer graphene GG12 may be a double-layer graphene including a first graphene 12 and a second graphene 22. In some cases, the multi-layer graphene GG12 may include three or more graphene layers. The multi-layer graphene GG12 may be grown on another substrate (not shown) and then may be attached to the first substrate 1001. The first substrate 1001 may be a handling substrate and may have a flexible property. The first underlayer 1101 may be, for example, a polymer layer. However, the materials and characteristics of the first substrate 1001 and the first underlayer 1101 may be changed.

Referring to FIG. 10B, a first mask pattern M100 may be formed on the second graphene 22. The first mask pattern M100 may have a first opening H100. The first opening H100 may be used for forming a nanopattern portion in the second graphene 22. For example, the first opening H100 may have a shape for defining a nanopattern portion of a nanoribbon or nanomesh structure. The first mask pattern M100 may be formed of, for example, a photosensitive (photoresist) material. Alternatively, the first mask pattern M100 may be formed of oxide, nitride, or the like.

Referring to FIG. 10C, a portion of the second graphene 22, exposed by the first opening H100, may be changed into a fluorinated graphene region FG22. A method of forming the fluorinated graphene region FG22 may be the same as, or similar to, the method of forming the fluorinated graphene 20a of FIG. 7C. A patterned graphene region PG22 may be defined by the fluorinated graphene region FG22. The patterned graphene region PG22 may include a graphene nanoribbon (GNR) or graphene nanomesh (GNM) region. That is, the patterned graphene region PG22 may have a form similar to that of the patterned graphene region PG30 of FIG. 5 or the patterned graphene region PG30' of FIG. 6.

Next, the first mask pattern M100 may be removed. A resultant structure is illustrated in FIG. 10D.

Referring to FIGS. 10E and 10F, the first graphene 12 and second graphene 22 of the first substrate 1001 may be transferred onto a second substrate 1002. In this case, the second graphene 22 indicates the whole region, which includes the fluorinated graphene region FG22 and the patterned graphene region PG22. A method of transferring the first graphene 12 and the second graphene 22 may be the same as, or similar to, the method of transferring the fluorinated graphene 20A, described with reference to FIGS. 8A and 8B.

Referring to FIG. 10F, the second graphene 22 and the first graphene 12 are sequentially deposited on the second substrate 1002. In this case, a second underlayer 1102 may be formed between the second substrate 1002 and the second graphene 22. The second substrate 1002 and the second underlayer 1102 may correspond to the substrate 100 and the underlayer 110, respectively, illustrated in FIG. 7A.

Referring to FIG. 10G, a second mask pattern M200 may be formed on the first graphene 12. The second mask pattern M200 may have a second opening H200. The second opening H200 may be used for forming a fluorinated region in the first graphene 12. In other words, the second opening H200 may be used for forming a gate insulating layer region in the first graphene 12.

Referring to FIG. 10H, a portion of the first graphene 12, exposed by the second opening H200, may be changed into a fluorinated graphene 12a. A method of forming the fluorinated graphene 12a may be the same as, or similar to, the method of forming the fluorinated graphene 20a of FIG. 7C. Hereinafter, the fluorinated graphene 12a is referred to as a gate insulating layer. The second graphene 22 including the patterned graphene region PG22 may be referred to as a channel layer. The patterned graphene region PG22 may be referred to as a channel region.

Next, the second mask pattern M200 may be removed. A resultant structure is illustrated in FIG. 10I.

Referring to FIG. 10J, a third graphene 32 may be transferred onto the first graphene 12 including the gate insulating layer 12a. A method of transferring the third graphene 32 onto the first graphene 12 may be substantially the same as, or similar to, a general method of transferring graphene.

Referring to FIG. 10K, a third mask pattern M300 may be formed on the third graphene 32. The third mask pattern M300 may have a third opening H300. The third opening H300 may have a form for forming a gate region in the third graphene 32. In other words, the third mask pattern M300 having the third opening H300 may be used for defining a gate in the third graphene 32.

Next, a portion of the third graphene 32, exposed by the third opening H300, may be changed into a fluorinated graphene 32a. As a result, a graphene gate 32G may be defined on the gate insulating layer 12a.

Next, the third mask pattern M300 may be removed. A resultant structure is illustrated in FIG. 10L.

Referring to FIG. 10M, a fourth mask pattern M400 may be formed at both sides of the graphene gate 32G to cover the third graphene 32. The fourth mask pattern M400 may be used for removing the third graphene 32 at both sides of the graphene gate 32G. The fourth mask pattern M400 may be formed by using the same material and method as the mask pattern 150 of FIG. 7B.

When removing the fourth mask pattern M400 by using a predetermined (or, alternatively, select) wet etching method, a portion of the third graphene 32 under the fourth mask pattern M400 may be removed while the fourth mask pattern M400 is removed. A resultant structure is illustrated in FIG. 10N.

Next, a structure illustrated in FIG. 10O may be obtained by removing the first graphene 12 at both sides of the gate insulating layer 12a. A method of removing the first graphene 12 at both sides of the gate insulating layer 12a may be the same as, or similar to, the method of removing the third graphene 32, described with reference to FIGS. 10M and 10N.

Referring to FIG. 10P, a gate electrode 3000 may be formed on the graphene gate 32G. A source electrode 4000A and a drain electrode 4000B may be formed on portions of the second graphene 22, exposed at both sides of the gate electrode 3000. The materials of the gate electrode 3000, source electrode 4000A, and drain electrode 4000B may be the same as, or similar to, those of the electrode 300, source electrode 400A, and drain electrode 400B, illustrated in FIG. 7E. In addition, methods of forming the gate electrode 3000, source electrode 4000A, and drain electrode 4000B may be the same as or similar to those of the electrode 300, source electrode 400A, and drain electrode 400B, illustrated in FIG. 7E.

By using the method of FIGS. 10A through 10P, the transistor described with reference to FIGS. 4 through 6 or a transistor similar thereto may be manufactured. The patterned graphene region PG22 may have a large bandgap compared to a non-patterned graphene sheet, and thus, the transistor according to the current example embodiment may have excellent operational characteristics. In addition, in the current example embodiment, the patterned graphene region PG22 is defined by using a region (that is, the fluorinated graphene region FG22) chemically converted from graphene. That is, the patterned graphene region PG22 may be formed without using an etching process. Accordingly, problems due to etching may be fundamentally prevented.

Additionally, the method of FIGS. 10A through 10P may be variously modified. For example, an additional insulating layer (a second gate insulating layer) (not shown) may be further formed between the gate insulating layer 12a and the graphene gate 32G. In more detail, in the process of FIG. 10J, before forming (transferring) the third graphene 32 on the first graphene 12 and the gate insulating layer 12a, an additional insulating layer may be formed on the first graphene 12 and the gate insulating layer 12a. After forming the additional insulating layer, the third graphene 32 may be formed (transferred) on the additional insulating layer, and the graphene gate 32G may be formed from the third graphene 32. When the additional insulating layer is further formed, insulation characteristics between the graphene gate 32G and the patterned graphene region PG22 (that is, a channel layer) may be improved. The material, thickness, and formation method of the additional insulating layer may be the same as, or similar to, those of the additional insulating layer described with reference to FIG. 7E.

In addition, in the process of FIG. 10L, portions of the third graphene 32 at both sides of the graphene gate 32G may not be removed, and the source electrode 4000A and the drain electrode 4000B may be formed on the portions of the third graphene 32. Alternatively, in the process of FIG. 10N, portions of the first graphene 12 at both sides of the gate insulating layer 12a may not be removed, and the source electrode 4000A and the drain electrode 4000B may be formed on the portions of the first graphene 12. Besides, the method of FIGS. 10A through 10P may be variously modified.

According to the above example embodiments, a high quality transistor (a graphene transistor) may be easily manufactured. The high quality transistor may be applied to various electronic devices, such as a radio frequency (RF) device for high frequency, display, etc. In addition, a transistor according to any one of the above example embodiments may be formed on a transparent substrate, and thus may be applied to a transparent display or the like.

It should be understood that the example embodiments described therein should be considered in a descriptive sense only and not for purposes of limitation. For example, it would be apparent to one of ordinary skill in the art in example embodiments that the structures of the transistors of FIGS. 1 through 6 may be variously modified. For example, various materials (that is, materials based on graphene) other than a fluorinated graphene may be used for a gate insulating layer. For example, one of the other materials for the gate insulating layer may be graphene oxide. In addition, although in the example embodiments described above, a gate is disposed on a channel layer, the gate may be disposed under the channel layer. The methods of FIGS. 7A through 7E, FIGS. 8A through 8D, FIGS. 9A through 9E, and FIGS. 10A through 10P may be variously modified. Further, it would be obvious to one of ordinary skill in the art that example embodiments may be applied to a semiconductor device, other than the HEMT. Therefore, the scope of the disclosure is defined not by the above detailed description but by the appended claims.

What is claimed is:

1. A transistor, comprising:
a channel layer including graphene;
a gate insulating layer on a surface of the channel layer, the gate insulating layer including fluorinated graphene;
a gate facing the channel layer, the gate insulating layer being between the gate and the channel layer; and
a source and a drain electrically connected to first and second regions of the channel layer, respectively.

2. The transistor of claim 1, wherein the gate includes graphene.

3. The transistor of claim 1, wherein,
the channel layer includes a patterned graphene region, and
the patterned graphene region is a nanoscale patterned region.

4. The transistor of claim 3, wherein,
the channel layer includes a fluorinated graphene region and a non-fluorinated graphene region, and
the non-fluorinated graphene region corresponds to the patterned graphene region.

5. The transistor of claim 3, wherein the patterned graphene region includes a graphene nanoribbon (GNR) region.

6. The transistor of claim 3, wherein the patterned graphene region includes a graphene nanomesh (GNM) region.

7. The transistor of claim 1, wherein the channel layer is a single-layer graphene.

8. The transistor of claim 1, wherein the gate insulating layer is a fluorinated single-layer graphene.

9. The transistor of claim 1, wherein the gate insulating layer further comprises an insulating layer between the fluorinated graphene and the gate.

10. The transistor of claim 1, wherein,
the gate insulating layer is on a portion of the channel layer,
the source is on the channel layer at one side of the gate insulating layer, and
the drain is on the channel layer at another side of the gate insulating layer.

11. The transistor of claim 10, further comprising:
a first graphene region between the channel layer and the source; and
a second graphene region between the channel layer and the drain.

12. A transistor, comprising:
a channel layer including a region comprised of graphene with a chemical modifier attached and a patterned graphene region defined by the region;
a gate insulating layer on a surface of the channel layer, the gate insulating layer including fluorinated graphene;
a gate facing the channel layer, the gate insulating layer being between the gate and the channel layer; and
a source and a drain electrically connected to first and second regions of the channel layer, respectively.

13. The transistor of claim 12, wherein the region comprised of graphene with a chemical modifier attached is chemically converted from graphene without the chemical modifier attached.

14. The transistor of claim 12, wherein the region comprised of graphene with a chemical modifier attached is a fluorinated graphene region.

15. The transistor of claim 12, wherein the patterned graphene region includes a graphene nanoribbon (GNR) region or a graphene nanomesh (GNM) region.

16. The transistor of claim 12, wherein the gate includes graphene.

17. A transistor, comprising:
a channel layer, a gate insulating layer, a gate, a source, and a drain, wherein the channel layer, the gate insulating layer, and the gate include at least one of graphene and a material comprised of graphene with a chemical modifier attached.

18. The transistor of claim 17, wherein the material comprised of graphene with a chemical modifier attached is chemically converted from graphene without a chemical modifier attached.

19. The transistor of claim 17, wherein the gate insulating layer includes fluorinated graphene.

20. The transistor of claim 17, wherein the channel layer includes graphene.

21. The transistor of claim 20, wherein the channel layer includes a fluorinated graphene region and a patterned graphene region defined by the fluorinated graphene region.

22. The transistor of claim 17, wherein the gate includes graphene.

* * * * *